(12) United States Patent
Kim et al.

(10) Patent No.: US 8,525,212 B2
(45) Date of Patent: Sep. 3, 2013

(54) LIGHT EMITTING DIODE HAVING ELECTRODE EXTENSIONS

(75) Inventors: Kyoung Wan Kim, Ansan-si (KR); Ye Seul Kim, Ansan-si (KR); Jeong Hee Yang, Ansan-si (KR); Jae Moo Kim, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 157 days.

(21) Appl. No.: 12/962,365

(22) Filed: Dec. 7, 2010

(65) Prior Publication Data

US 2011/0156086 A1   Jun. 30, 2011

(30) Foreign Application Priority Data

Dec. 29, 2009  (KR) .................. 10-2009-0132998

(51) Int. Cl.
*H01L 33/38* (2010.01)
(52) U.S. Cl.
USPC   257/99; 257/623; 257/E23.015; 257/E33.065
(58) Field of Classification Search
USPC .................. 257/E29.329, E23.015, E21.015, 257/E33.065; 438/39
See application file for complete search history.

(56) References Cited

U.S. PATENT DOCUMENTS

| 6,650,018 | B1 | 11/2003 | Zhao et al. |
|---|---|---|---|
| 7,087,985 | B2 | 8/2006 | Park et al. |
| 7,429,755 | B2 | 9/2008 | Hsu |
| 7,935,979 | B2 | 5/2011 | Shum et al. |
| 8,148,736 | B2 | 4/2012 | Yahata et al. |
| 8,237,180 | B2 | 8/2012 | Lizuka et al. |
| 8,258,519 | B2 | 9/2012 | Hsu |
| 2004/0140473 | A1 | 7/2004 | Chen |
| 2006/0192223 | A1 | 8/2006 | Lee et al. |

(Continued)

FOREIGN PATENT DOCUMENTS

WO   WO 2008/155452 A1   *  12/2008

OTHER PUBLICATIONS

Notice of Allowance issued on Nov. 9, 2012 in U.S. Appl. No. 12/941,536.

(Continued)

*Primary Examiner* — Stephen W Smoot
(74) *Attorney, Agent, or Firm* — H. C. Park & Associates, PLC

(57) ABSTRACT

An exemplary embodiment of the present invention discloses a light emitting diode including a lower contact layer having a first edge, a second edge opposite to the first edge, a third edge connecting the first edge to the second edge, and a fourth edge opposite to the third edge, a mesa structure arranged on the lower contact layer, the mesa structure including an active layer and an upper contact layer, a first electrode pad arranged on the lower contact layer, a second electrode pad arranged on the mesa structure, a first lower extension and a second lower extension extending from the first electrode pad towards the second edge, distal ends of the first lower extension and the second lower extension being farther away from each other than front ends thereof contacting the first electrode pad, and a first upper extension, a second upper extension, and a third upper extension extending from the second electrode pad. In addition, the first upper extension and the second upper extension extend from the second electrode pad to enclose the first lower extension and the second lower extension, and the third upper extension extends to a region between the first lower extension and the second lower extension.

19 Claims, 3 Drawing Sheets

(56) References Cited

U.S. PATENT DOCUMENTS

2008/0142821 A1* 6/2008 Sakamoto et al. ............... 257/98
2008/0210972 A1* 9/2008 Ko et al. ......................... 257/99
2008/0296603 A1 12/2008 Chu
2011/0089442 A1* 4/2011 Jing et al. ........................ 257/91
2012/0037946 A1* 2/2012 Yu et al. ......................... 257/99

OTHER PUBLICATIONS

Non-Final Office Action issued on Jun. 10, 2013 in U.S. Appl. No. 12/941,536.

* cited by examiner

Prior Art

Prior Art

LIGHT EMITTING DIODE HAVING ELECTRODE EXTENSIONS

CROSS-REFERENCE TO RELATED APPLICATION

This application claims priority from and the benefit of Korean Patent Application No. 10-2009-0132998, filed on Dec. 29, 2009, which is hereby incorporated by reference for all purposes as if fully set forth herein.

BACKGROUND OF THE INVENTION

1. Field of the Invention

The present invention relates to a light emitting diode, and more particularly, to a light emitting diode having electrode extensions.

2. Discussion of the Background

Gallium nitride (GaN)-based light emitting diodes (LEDs) have been used for various applications, such as a natural color LED display device, an LED traffic signal, a white LED, or the like. Also, a high-efficiency white LED is expected to replace a fluorescent lamp.

In particular, the efficiency of the white LED reaches a similar level to the efficiency of the general fluorescent lamp.

A GaN-based LED is generally formed by growing epitaxial layers on a sapphire substrate, for example, and includes an N-type semiconductor layer, a P-type semiconductor layer, and an active layer interposed therebetween. Meanwhile, an N-electrode pad is formed on the N-type semiconductor layer and a P-electrode pad is formed on the P-type semiconductor layer. The electrode pads of the LED are electrically connected to an external power supply, which drives the LED.

Generally, the GaN-based semiconductor layers are grown on a single crystal substrate such as sapphire and then subjected to a chip separation process, thereby forming a single LED. In this case, the single crystal substrate is separated along a crystal surface, such that the substrate generally has a rectangular shape. Generally, the final shape of the LED limits a light emitting structure, for example, a mesa shape, an electrode pad shape, and a shape of the extensions extending from the electrode pad. For example, U.S. Pat. No. 6,650,018, issued to Zhao, et al., discloses extensions extending from electrode contacts in order to improve current spreading, wherein these extending parts generally extend in a straight line along an edge having a rectangular shape.

FIG. 1 is a plan view showing an LED according to the related art and FIG. 2 is a cross-sectional view taken along line A-A of FIG. 1.

Referring to FIG. 1 and FIG. 2, the LED includes a substrate 21 and a mesa structure M. In addition, the LED includes a lower contact layer 23, an active layer 25, an upper contact layer 27, a transparent electrode layer 29, a first electrode pad 31, a second electrode pad 33, lower extensions 31a, 31b, and 31c, and upper extensions 33a and 33b.

The lower extensions 31a and 31c extend from the first electrode pad 31 and the lower extensions 31b extend along the edge of the substrate 21 from the lower extensions 31a. Further, the lower extension 31c extends from the first electrode pad 31 towards the second electrode pad 33. The lower extensions 31b and 31c are parallel with each other and the lower extensions 31a extend in a direction crossing with the lower extensions 31b and 31c.

Meanwhile, the upper extensions 33a extend from the second electrode pad 33 and the upper extensions 33b extend from the upper extensions 33a, respectively. The upper extensions 33a are parallel with the lower extensions 31a and the upper extensions 33b are parallel with the lower extensions 31b and 31c. The upper extensions 33b each extend to a region between the lower extension 31b and the lower extension 31c.

According to the related art, the lower extensions 31a, 31b, and 31c are disposed on the lower contact layer 23 and the upper extensions 33a and 33b are disposed on the upper contact layer 27, thereby making it possible to improve current spreading capability in the LED. However, since there is a space formed between the lower extensions 31a, 31b, and 31c and the mesa structure M in order to form the lower extensions 31a, 31b, and 31c, the region of the mesa structure M is reduced by a larger area than the region of the lower extensions. As a result, the light emitting area of the LED may be reduced due to the formation of the lower extensions 31a, 31b, and 31c. In addition, the light emitting area may be reduced, since the lower extensions 31b are formed to enclose the upper extensions 33b and the lower extensions 31a connecting the lower extensions 31b to the first electrode pad 31 are required.

SUMMARY OF THE INVENTION

Exemplary embodiments of the present invention provide a light emitting diode capable of mitigating the reduction in a light emitting area due to the formation of electrode extensions.

Exemplary embodiments of the present invention also provide a light emitting diode capable of improving current spreading by adopting electrode extensions having a new structure.

Additional features of the invention will be set forth in the description which follows, and in part will be apparent from the description, or may be learned by practice of the invention.

An exemplary embodiment of the present invention discloses a light emitting diode including a lower contact layer having a first edge, a second edge opposite to the first edge, a third edge connecting the first edge to the second edge, and a fourth edge opposite to the third edge, a mesa structure arranged on the lower contact layer, the mesa structure including an active layer and an upper contact layer, a first electrode pad arranged on the lower contact layer, a second electrode pad arranged on the mesa structure, a first lower extension and a second lower extension extending from the first electrode pad towards the second edge, distal ends of the first lower extension and the second lower extension being farther away from each other than front ends thereof contacting the first electrode pad, and a first upper extension, a second upper extension, and a third upper extension extending from the second electrode pad. In addition, the first upper extension and the second upper extension extend from the second electrode pad to enclose the first lower extension and the second lower extension, and the third upper extension extends to a region between the first lower extension and the second lower extension.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
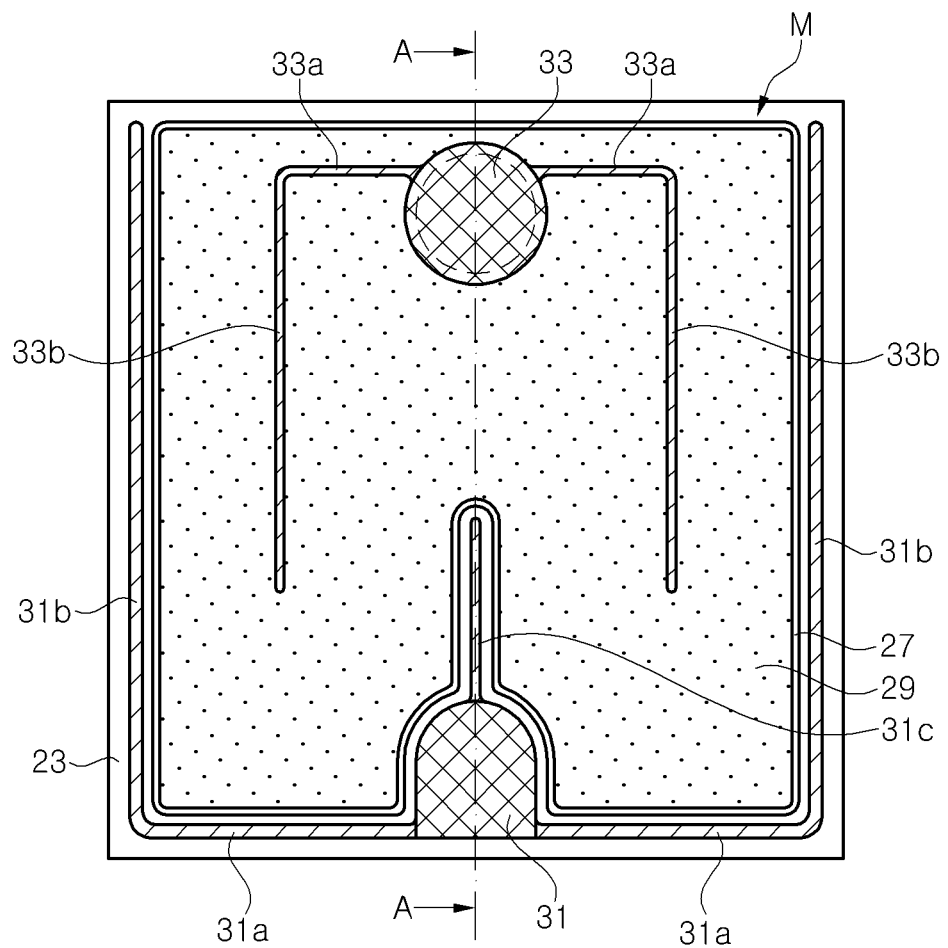
FIG. 1 is a plan view showing a light emitting diode according to the related art.
Figure 2:
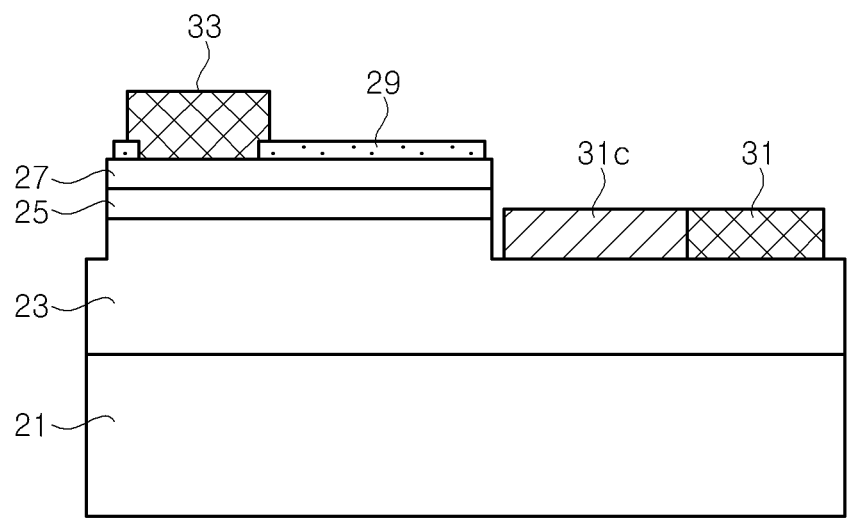
FIG. 2 is a cross-sectional view taken along line A-A of FIG. 1.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

Figure 3:
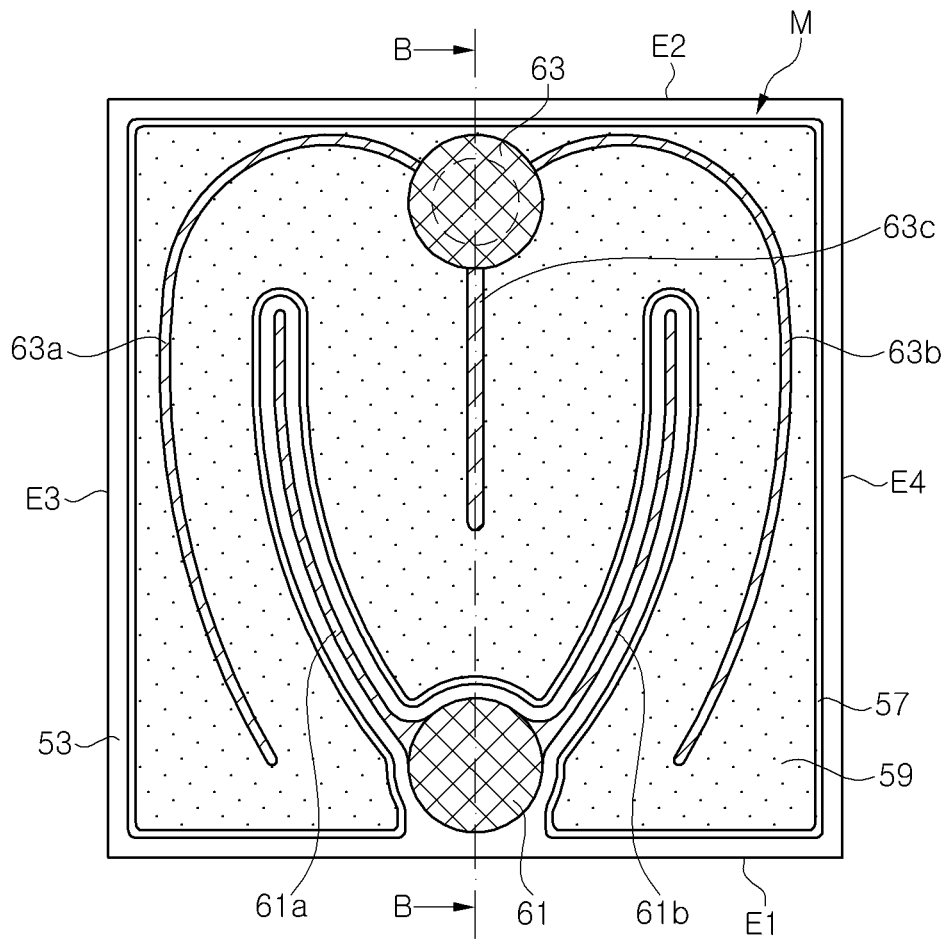
FIG. 3 is a plan view showing a light emitting diode according to an exemplary embodiment of the present invention.
Figure 4:
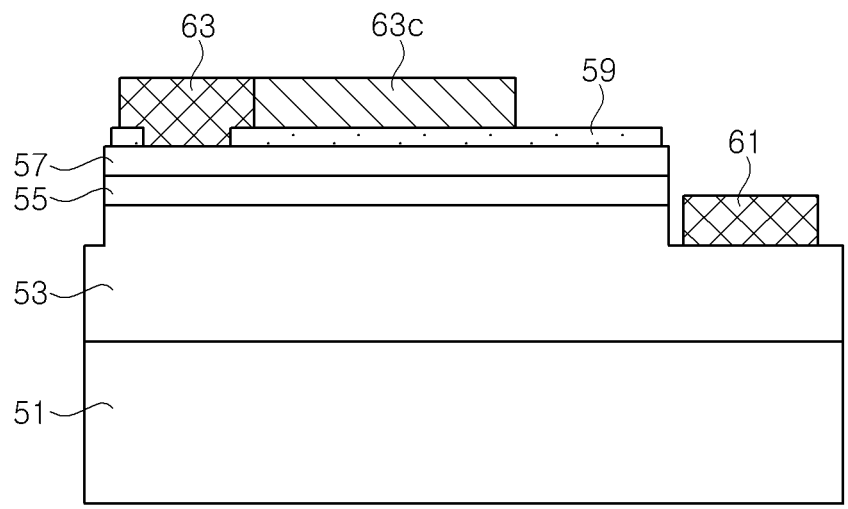
FIG. 4 is a cross-sectional view taken along line B-B of FIG. 3.

FIG. 3 is a plan view showing a light emitting diode according to an exemplary embodiment of the present invention, and FIG. 4 is a cross-sectional view taken along line B-B of FIG. 3.

Referring to FIG. 3 and FIG. 4, the light emitting diode includes a substrate 51 and a mesa structure M. In addition, the light emitting diode includes a lower contact layer 53, an active layer 55, an upper contact layer 57, a transparent electrode layer 59, a first electrode pad 61, a second electrode pad 63, a first lower extension 61a, a second lower extension 61b, and first, second, and third upper extensions 63a, 63b, and 63c.

The substrate 51 is not specifically limited to a particular material, and may be a sapphire substrate, for example. The substrate 51 has a substantially rectangular shape.

The lower contact layer 53 is disposed on the substrate 51. The lower contact layer 53 may have the same rectangular shape as the substrate 51. For example, the lower contact layer 53 has a first edge E1, a second edge E2 opposite to the first edge E1, a third edge E3 connecting the first edge E1 to the second edge E2, and a fourth edge E4 opposite to the third edge E3.

In addition, the mesa structure M is disposed on a part of a region of the lower contact layer 53, wherein the mesa structure M includes an active layer 55 and an upper contact layer 57. The mesa structure M may include a part of the lower contact layer 53. The lower contact layer 53 may be an n-type compound semiconductor layer and the upper contact layer 27 may be a p-type compound semiconductor layer, or vice versa. The active layer 55 is interposed between the lower contact layer 53 and the upper contact layer 57.

The lower contact layer 53, the active layer 55, and the upper contact layer 57 may be made of a gallium nitride-based compound semiconductor material, that is, (Al, In, Ga)N. The constituent elements and composition of the active layer 55 are selected so that the active layer 55 emits light having a required wavelength, for example, ultraviolet or blue light. The lower contact layer 53 and the upper contact layer 57 are made of a material having a larger band gap than that of the active layer 55.

The lower contact layer 53 and/or the upper contact layer 57 may be formed as a single layer structure as shown, or a multi-layer structure. In addition, the active layer 55 may be formed to have a single quantum well structure or a multi quantum well structure. In addition, a buffer layer (not shown) may be interposed between the substrate 51 and the lower contact layer 53.

The semiconductor layers 53, 55, and 57 may be grown using a metal-organic chemical vapor deposition (MOCVD) technology or a molecular beam epitaxy (MBE) technology, and the mesa structure M may be formed by patterning the region of the lower contact layer 53 to be exposed using a photolithography and etching process. In the present exemplary embodiment, the side of the mesa structure M may be formed to have a sloped surface by using a reflow process of a photoresist. The side surface of the mesa structure M may have a sloped surface having a single slope but is not limited thereto, and therefore, may be a bent slope surface or a double slope surface having a variable slope.

The mesa structure M has substantially the same shape as a plane shape of the lower contact layer 53. That is, the mesa structure M has four main sides along the first, second, third, and fourth edges E1, E2, E3, and E4 of the lower contact layer 53. However, the side near the first edge E1 is formed with depression parts, so that the first electrode pad 61 and the first and second lower extensions 61a and 61b are formed on the lower contact layer 53. The mesa structure M may have a symmetrical structure in order to evenly spread current over the light emitting region.

Meanwhile, the transparent electrode layer 59 may make ohmic contact with the upper contact layer 57 and may be made of indium tin oxide (ITO) or Ni/Au. The transparent electrode layer 59 has a lower resistivity than the upper contact layer 57, so that the transparent electrode layer 59 serves to spread current in the light emitting diode.

The first electrode pad 61 is disposed on the lower contact layer 53. The first electrode pad 61 is disposed near the center of the first edge E1 of the lower contact layer 53 and is formed in the depression part of the mesa structure M. The first electrode pad 61, which is, for example, an n-electrode pad, is a portion where wires for connecting the light emitting diode to an external power supply may be bonded.

The first and second lower extensions 61a and 61b extend towards the second edge E2 from the first electrode pad 61. The first and second lower extensions 61a and 61b may extend to have a symmetrical structure to each other, as shown in FIG. 3. The lower extensions 61a and 61b extend directly from the first electrode pad 61 towards the second edge E2. Therefore, separate extensions for connecting the lower extensions 61a and 61b to the first electrode pad 61 may be omitted. Meanwhile, distal ends of the first and second lower extensions 61a and 61b are farther away from each other than front ends contacting the first electrode pad 61. The lower extensions 61a and 61b may have a straight shape but may alternatively have a shape convexly bent towards the third edge E3 and the fourth edge E4, respectively. That is, the first lower extension 61a may have a shape convexly bent to the third edge E3 and the second lower extension 61b may have a shape convexly bent to the fourth edge E4. Both the first and second lower extensions 61a and 61b may each have a bent shape, but a part thereof, such as the distal ends, may have a straight shape. In addition, the front ends of the first and second lower extensions 61a and 61b may be farther away from the first edge E1 than the center of the first electrode pad 61.

Meanwhile, the second electrode pad 63 is disposed on the upper contact layer 57 and is disposed near the center of the second edge E2 of the lower contact layer 53. The second electrode pad 63, which is, for example, a p-electrode pad, may contact the upper contact layer 57, penetrating through the transparent electrode layer 59 as shown in FIG. 4, but is not necessarily limited thereto, and may alternatively be disposed on the transparent electrode layer 59.

The first upper extension 63a, the second upper extension 63b, and the third upper extension 63c extend from the second electrode pad 63. The first and second upper extensions 63a and 63b may be symmetrical with each other with respect to a straight line connecting the first electrode pad 61 to the second electrode pad 63. In addition, the first and second upper extensions 63a and 63b extend from the second electrode pad 63 to enclose the first and second lower extensions 61a and 61b. That is, the first and second upper extensions 63a and 63b are disposed to be closer to the third edge E3 and the fourth edge E4, respectively, than the first and second lower extensions 61a and 61b.

Further, as shown in FIG. 3, the first and second upper extensions 63a and 63b may have a shape convexly bent towards the third edge E3 and the fourth edge E4, respectively. In addition, the first and second upper extensions 63a and 63b may each extend towards the second edge E2 from the second electrode pad 63 and may extend towards the first edge E1.

Therefore, the distance from the distal ends of the first and second lower extensions 61a and 61b to the first and second upper extensions 63a and 63b can be controlled.

In addition, distal ends of the first and second upper extensions 63a and 63b may be closer to the first edge E1 than the front ends of the first and second lower extensions. For example, the distal ends of the first and second upper extensions 63a and 63b may be disposed on a straight line passing through the center of the first electrode pad 61 parallel with the first edge. That is, the shortest distance from the first edge E1 to the center of the first electrode pad 61 and the shortest distance from the first edge E1 to each of the distal ends of the first and second upper extensions 63a and 63b may be the same. Alternatively, the shortest distance from the first edge E1 to each of the distal ends of the first and second upper extensions 63a and 63b may be shorter than the shortest distance to the center of the first electrode pad 61.

The first and second upper extensions 63a and 63b may extend to be relatively close to the third edge E3 and the fourth edge E4, respectively, and then extend to be relatively farther away from the third edge E3 and the fourth edge E4. The distance between the first and second upper extensions 63a and 63b and the first and second lower extensions 61a and 61b may be maintained to be substantially constant, such that current may be evenly spread over most of the regions of the mesa structure M. Further, the front ends of the first and second upper extensions 63a and 63b contacting the second electrode pad 63 may be closer to the second edge E2 than the center of the second electrode pad 63. As a result, it can prevent the distance between the first and second upper extensions 63a and 63b and the second edge E2 from being far away.

In the exemplary embodiments of the present invention, the second electrode pad 63 is disposed on the mesa structure M and is also disposed near the second edge E2. In order to evenly spread current flowing into the light emitting diode over a wide region, the second electrode pad 63 may be disposed to be maximally close to the second edge E2. Further, the shortest distance between each of the first and second upper extensions 63a and 63b and the second edge E2 may be the same as the shortest distance between the second electrode pad 63 and the second edge E2. Therefore, the first and second upper extensions 63a and 63b may be disposed to be substantially closer to the vicinity of the second edge E2 compared to the related art.

The third upper extensions 63c extend to a region between the first and second lower extensions 61a and 61b. The third upper extension 63c extends towards the first electrode pad 61 in a straight shape and passes through the center of the mesa structure M.

Generally, current may be concentrated on a straight line between the electrode pads 61 and 63. Therefore, the shortest distance to the first upper extension 63a from each point of the first lower extension 61a may be shorter than the shortest distance to the third upper extension 63c from each point of the first lower extension 61a. Therefore, current can be spread over the wide region of the mesa structure M.

Further, the shortest distance reaching the first upper extension 63a from the distal end of the first lower extension 61a may be shorter than the shortest distance reaching the first upper extension 63a from other points of the first lower extension 61a. That is, the shortest distance between the first lower extension 61a and the first upper extension 63a is from the distal end of the first lower extension 61a. Further, the shortest distance from the distal end of the third upper extension 63c to the first lower extension 61a is shorter than the shortest distance to the first electrode pad 61.

EXPERIMENTAL EXAMPLE

The stacked structure of the gallium nitride-based semiconductor layer and the transparent electrode layer were formed under the same conditions, and the light emitting diodes shown in FIG. 1 (Comparative Example) and FIG. 3 (Example) were manufactured, and then the light emitting area, the light output, and the forward voltage at 350 mA were measured, which are listed in the following Table 1. The size of the light emitting diode used in the experimental example was 600 μm×600 μm and the area of the active layer in the light emitting diode and the area of the second electrode pads and the second extensions were obtained by being calculated from a layout, the light emitting area was obtained by subtracting the area of the second electrode pads and the second extensions from the area of the active layer, which were shown by the relative value based on the light emitting diode of FIG. 1.

TABLE 1

|  | Comparative Example | Example | Remark |
|---|---|---|---|
| Light emitting area | 100 | 104.9 | 4.9% increase |
| Light output | 100 | 102.35 | 2.35% increase |
| Forward voltage (@350 mA) | 100 | 98.11 | 1.89% reduction |

Referring to Table 1, in the case of the Example, the area of the active layer was larger by 5%, the light output was improved by 2% or more, and the forward voltage was reduced by about 2%, as compared to the Comparative Example.

According to the exemplary embodiment, first and second upper extensions are disposed on the mesa structure to enclose the first and second lower extensions disposed on the lower contact layer, to reduce the area occupied by the first and second lower extensions. Therefore, the present invention can mitigate the reduction in light emitting area removed in order to form the first and second lower extensions. It is also possible to improve current spreading capability by disposing the electrode extensions at specific positions, thereby improving the light output and reducing the forward voltage.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode, comprising:
    a lower contact layer comprising a first edge, a second edge opposite to the first edge, a third edge connecting the first edge to the second edge, and a fourth edge opposite to the third edge;
    a mesa structure arranged on the lower contact layer, the mesa structure comprising an active layer and an upper contact layer;
    a first electrode pad arranged on the lower contact layer;
    a second electrode pad arranged on the mesa structure;
    a first lower extension and a second lower extension extending from the first electrode pad towards the second edge, distal ends of the first lower extension and the second lower extension being farther away from each other than front ends thereof contacting the first electrode pad; and
    a first upper extension, a second upper extension, and a third upper extension extending from the second electrode pad,
    wherein the first upper extension and the second upper extension extend from the second electrode pad to enclose the first lower extension and the second lower extension, and the third upper extension extends to a region between the first lower extension and the second lower extension, and
    wherein the first lower extension and the second lower extension comprise a shape convexly bent towards the third edge and the fourth edge, respectively.

2. The light emitting diode of claim 1, wherein the front ends of the first lower extension and the second lower extension are farther away from the first edge than the center of the first electrode pad.

3. The light emitting diode of claim 2, wherein the first upper extension and the second upper extension comprise a shape convexly bent towards the third edge and the fourth edge, respectively.

4. The light emitting diode of claim 3, wherein the first upper extension and the second upper extension each extend towards the second edge from the second electrode pad and then extend towards the first edge.

5. The light emitting diode of claim 4, wherein distal ends of the first upper extension and the second upper extension are closer to the first edge than front ends of the first lower extension and the second lower extension.

6. The light emitting diode of claim 5, wherein the distal ends of the first upper extension and the second upper extension are disposed on a straight line passing through the center of the first electrode pad, the straight line parallel to the first edge.

7. The light emitting diode of claim 4, wherein the first upper extension and the second upper extension extend to be relatively closer to the third edge and the fourth edge, respectively, and then extend to be relatively farther away from the third edge and the fourth edge, respectively.

8. The light emitting diode of claim 4, wherein front ends of the first upper extension and the second upper extension contacting the second electrode pad extend to a distance from the second edge that is less than a distance from the center of the second electrode pad to the second edge.

9. The light emitting diode of claim 8, wherein the shortest distance between the first upper extension and the second edge is substantially the same as the shortest distance between the second electrode pad and the second edge.

10. The light emitting diode of claim 1, wherein the shortest distance between the first upper extension and each point of the first lower extension is shorter than the shortest distance between the third upper extension and each point of the first lower extension.

11. The light emitting diode of claim 10, wherein the shortest distance between the first upper extension and the distal end of the first lower extension is shorter than the shortest distance between the first upper extension and other points of the first lower extension.

12. The light emitting diode of claim 11, wherein the shortest distance between the first lower extension and a distal end of the third upper extension is shorter than the shortest distance between the first electrode pad and the distal end of the third upper extension.

13. The light emitting diode of claim 1, wherein the mesa structure comprises a symmetrical structure along a straight line passing through the centers of the first electrode pad and the second electrode pad.

14. A light emitting diode, comprising:
    a lower contact layer comprising a first edge, a second edge opposite to the first edge, a third edge connecting the first edge to the second edge, and a fourth edge opposite to the third edge;
    a mesa structure arranged on the lower contact layer, the mesa structure comprising an active layer and an upper contact layer;
    a first electrode pad arranged on the lower contact layer;
    a second electrode pad arranged on the mesa structure;
    a first lower extension and a second lower extension extending from the first electrode pad towards the second edge, distal ends of the first lower extension and the second lower extension being farther away from each other than front ends thereof contacting the first electrode pad; and
    a first upper extension, a second upper extension, and a third upper extension extending from the second electrode pad,
    wherein the first upper extension and the second upper extension extend from the second electrode pad to enclose the first lower extension and the second lower extension, and the third upper extension extends to a region between the first lower extension and the second lower extension, and
    wherein the first upper extension and the second upper extension each extend towards the second edge from the second electrode pad and then extend towards the first edge.

15. The light emitting diode of claim 14, wherein distal ends of the first upper extension and the second upper extension are closer to the first edge than front ends of the first lower extension and the second lower extension.

16. The light emitting diode of claim 15, wherein the distal ends of the first upper extension and the second upper extension are disposed on a straight line passing through the center of the first electrode pad, the straight line parallel to the first edge.

17. The light emitting diode of claim 14, wherein front ends of the first upper extension and the second upper extension contacting the second electrode pad extend to a distance from the second edge that is less than a distance from the center of the second electrode pad to the second edge.

18. The light emitting diode of claim 17, wherein the shortest distance between the first upper extension and the second edge is substantially the same as the shortest distance between the second electrode pad and the second edge.

19. A light emitting diode, comprising:
- a lower contact layer comprising a first edge, a second edge opposite to the first edge, a third edge connecting the first edge to the second edge, and a fourth edge opposite to the third edge;
- a mesa structure arranged on the lower contact layer, the mesa structure comprising an active layer and an upper contact layer;
- a first electrode pad arranged on the lower contact layer;
- a second electrode pad arranged on the mesa structure;
- a first lower extension and a second lower extension extending from the first electrode pad towards the second edge, distal ends of the first lower extension and the second lower extension being farther away from each other than front ends thereof contacting the first electrode pad; and
- a first upper extension, a second upper extension, and a third upper extension extending from the second electrode pad, wherein the first upper extension and the second upper extension extend from the second electrode pad to enclose the first lower extension and the second lower extension, and the third upper extension extends to a region between the first lower extension and the second lower extension, and wherein the first upper extension and the second upper extension extend to be relatively closer to the third edge and the fourth edge, respectively, and then extend to be relatively farther away from the third edge and the fourth edge, respectively.

* * * * *